(12) United States Patent
Shibata et al.

(10) Patent No.: US 7,758,354 B2
(45) Date of Patent: Jul. 20, 2010

(54) SET OF CIRCUIT BOARD CONNECTORS

(75) Inventors: Takahiro Shibata, Yokkaichi (JP);
Yasuo Matsushita, Yokkaichi (JP);
Tsutomu Tanaka, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 12/120,402

(22) Filed: May 14, 2008

(65) Prior Publication Data

US 2008/0287002 A1    Nov. 20, 2008

(30) Foreign Application Priority Data

May 16, 2007    (JP) .............................. 2007-130017

(51) Int. Cl.
*H01R 12/00* (2006.01)
(52) U.S. Cl. ........................................ 439/79; 439/954
(58) Field of Classification Search ................. 439/573, 439/564, 954, 79–80
See application file for complete search history.

(56) References Cited

U.S. PATENT DOCUMENTS

| | | | | |
|---|---|---|---|---|
| 5,125,853 A | * | 6/1992 | Hashiguchi | ............ 439/607.26 |
| 5,194,019 A | * | 3/1993 | Rose | ........................... 439/569 |
| 6,065,979 A | * | 5/2000 | Lai et al. | ....................... 439/79 |
| 6,827,607 B2 | * | 12/2004 | Fujita et al. | .................. 439/573 |
| 7,037,146 B2 | * | 5/2006 | Nakamura | .................... 439/751 |
| 7,438,576 B2 | * | 10/2008 | Sakakura | ..................... 439/206 |
| 2003/0190839 A1 | | 10/2003 | Fujita et al. | |

* cited by examiner

*Primary Examiner*—Xuong M Chung-Trans
(74) *Attorney, Agent, or Firm*—Gerald E. Hespos; Michael J. Porco (57) ABSTRACT

A horizontal connector (10A) is configured for mounting on a circuit board (90) so that a connecting direction with a mating connector is parallel to the surface of the circuit board (90). A vertical connector (10B) is configured for mounting on the circuit board (90) so that a connecting direction with a mating connector is normal to the surface of the circuit board (90). Board connecting portions (35A, 35B) of terminal fittings (30A, 30B) to be inserted into connection holes (91) and mounting holes (16A, 16B) of mounting portions (12A, 12B) to be mounted to fixing holes (92) are arranged at the same positions for both the horizontal connector (10A) and vertical connector (10B). Therefore, the circuit board (90) can be commonly used for both horizontal connector (10A) and vertical connector (10B).

5 Claims, 9 Drawing Sheets

SET OF CIRCUIT BOARD CONNECTORS

BACKGROUND OF THE INVENTION

1. Field of the Invention.

The invention relates to a set of circuit board connectors used by being mounted on a circuit board.

2. Description of the Related Art.

U.S. Pat. No. 7,037,146 discloses a vertical connector with a receptacle for receiving a mating connector. Terminal fittings are mounted through the back wall of the receptacle. Mounting portions project outwardly from the receptacle and are fixed to the circuit board by screws. The terminal fittings are formed straight and the connector is mounted on a circuit board with an opening of the receptacle facing vertically.

U.S. Pat. No. 7,037,146 discloses a horizontal connector provided with a receptacle for receiving a mating connector. Terminal fittings are mounted through the back wall of the receptacle. Mounting portions project outward from the receptacle and are fixed to the circuit board by screws. The terminal fittings are bent in an L-shape and the connector is mounted on a circuit board with the opening of the receptacle facing horizontally.

The circuit board for both the vertical connector and the horizontal connector has connection holes for receiving ends of the terminal fittings, and fixing holes at positions corresponding to the mounting portions.

The present invention was developed in view of the above situation and an object thereof is to make a circuit board more versatile.

SUMMARY OF THE INVENTION

The invention relates to a set of circuit board connectors comprising at least two types of connectors. Each connector has a receptacle for receiving a mating connector. Terminal fittings are mounted through a back wall of the receptacle and project outwardly from the back wall to be inserted into connection holes of a circuit board. Mounting portions are provided in conformity with fixing holes of the circuit board. The at least two types of connectors include a first connector to be mounted on the circuit board so that a connecting direction with the mating connector is substantially parallel to the board surface direction of the circuit board, and a second connector to be mounted on the circuit board so that a connecting direction with the mating connector is at an angle, and preferably a right angle to the surface of the circuit board. Parts of the terminal fittings to be inserted into the connection holes and parts of the mounting portions to be mounted with respect to the fixing holes are arranged at the substantially same positions in the first and second connectors. Accordingly, one type of circuit board can be used for two types of connectors, and it is not necessary to prepare special circuit boards for the respective connectors.

The mounting portions preferably project out from the receptacle.

A multitude of the parts of the respective terminal fittings to be inserted into the connection holes preferably are arranged in a row direction and/or a column direction to form a terminal group.

The parts of the mounting portions to be mounted with respect to the fixing holes preferably are arranged at least in a pair at substantially opposite sides of the terminal group in the row direction.

A formation range of the connection holes and the fixing holes of the circuit board can be made smaller in the column direction. Therefore, a space in the column direction can be utilized effectively.

The parts of the mounting portions to be mounted with respect to the fixing holes preferably are arranged at positions corresponding to the center of the terminal group in the column direction.

A solder connecting operation may be performed for the terminal fittings inserted in the connection holes at one end in the column direction with the mounting portions mounted with respect to the fixing holes. In this situation, excessive stress can be prevented from acting on the terminal fittings inserted in the connection holes located at the other end in the column direction due to a solder connecting operation. Thus, the solder connecting operation can be performed satisfactorily at both ends in the column direction.

The mounting portions of the first connector preferably are arranged at the substantially opposite sides in the row direction with the outwardly projecting parts of the respective terminal fittings from the back wall of the receptacle located therebetween and are formed to cover the respective terminal fittings at the substantially opposite sides in the row direction. Thus, the deformations of the exposed parts due to interference with external matters can be prevented.

The mounting portion preferably has a projecting distance greater than the height of the terminal fittings located most closely to the circuit board.

The second connector preferably has at least two lateral projections projecting towards the circuit board so that exposed parts of the terminal fittings, except the leading end portions, are protected by the projections.

Mounting members preferably are insertable into the fixing holes from a side opposite to the mounting side of the circuit board and the leading ends thereof are engaged with mounting holes of the mounting portions.

The mounting members preferably are tapping screws. Threads of the tapping screws can bite in or engage the inner surfaces of the respective mounting holes and the receptacle can be fixed by the tapping screws.

These and other objects, features and advantages of the present invention will become more apparent upon reading of the following detailed description of preferred embodiments and accompanying drawings. It should be understood that even though embodiments are separately described, single features thereof may be combined to additional embodiments.

DETAILED DESCRIPTION OF THE PREFERRED EMBODIMENTS

One preferred embodiment of the invention is described with reference to FIGS. 1 to 9. In this embodiment, a horizontal connector 10A and a vertical connector 10B are prepared and either can be mounted in an appropriate posture on a circuit board 90 depending on the situation.

The horizontal connector 10A is illustrated in FIGS. 1 to 5 and has a receptacle 11A made e.g. of synthetic resin. More mounting portions 12A project from the receptacle 11A and terminal fittings 30A made of a conductive metal plate are mounted in the receptacle 11A. The receptacle 11A has a wide flat shape and a back wall 13A thereof is formed with fitting holes 14A, through which the terminal fittings 30A are pressed. A lock projection 15A is provided on the inner surface of the upper wall of the receptacle 11A for holding the horizontal connector 10A connected with an unillustrated mating female connector. The fitting holes 14A are aligned in a width direction at upper and lower stages, and the terminal fittings 30A are individually insertable into the respective fitting holes 14A. An opening surface OS-A of the receptacle 11A faces in a direction OD-A substantially parallel to the board surface direction BSD of the circuit board 90 when the horizontal connector 10A is mounted on a circuit board 90. Thus, the mating connector is insertable horizontally into the receptacle 11A through the open surface from the front along a direction parallel to the board surface direction BSD or to the plane of the circuit board 90.

Figure 1:
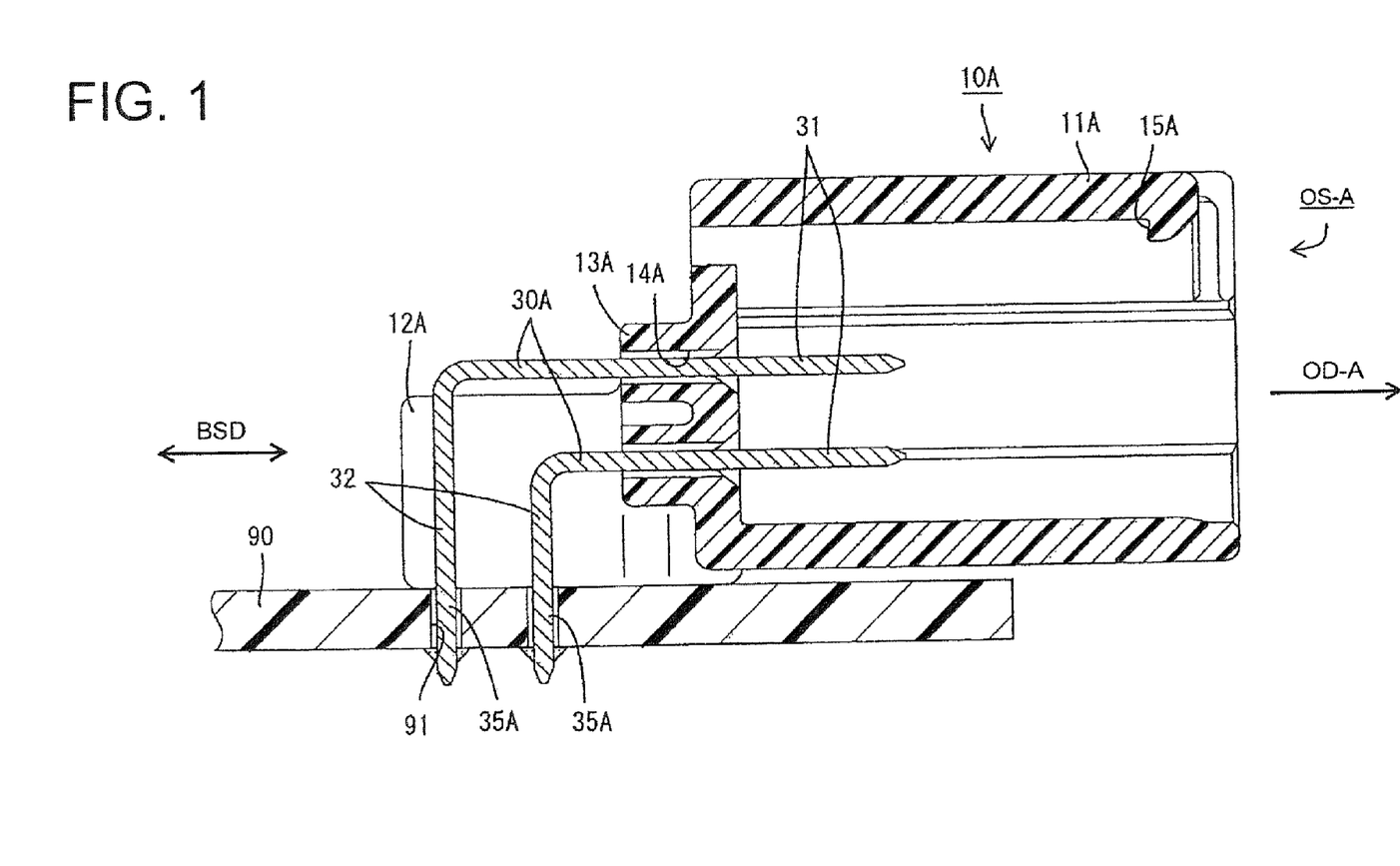
FIG. 1 is a section of a horizontal connector mounted on a circuit board in one embodiment of the invention.

Each terminal fitting 30A is a long narrow tab bent at a substantially right angle to define an L-shape. Horizontal sections 31A are defined adjacent one end of each terminal fitting 30A and are substantially parallel with the board surface direction BSD of the circuit board 90. The horizontal sections 31A penetrate through the back wall 13A and project into the receptacle 11A. Vertical sections 32 are defined adjacent the other end of each terminal fitting 30A and are aligned at substantially right angles to the board surface direction BSD of the circuit board 90. The vertical sections 32 are inserted into connection holes 91 formed in the circuit board 90 for connection by press-fitting, soldering or the like. A board connecting portion 35A is defined at the bottom end of the vertical section 32 and is a substantially round pin to be inserted into the connection hole 91 of the circuit board 90. The remaining part other than the board connecting portion 35A preferably substantially is in the form of a strip wider than the board connecting portion 35A.

Figure 3:
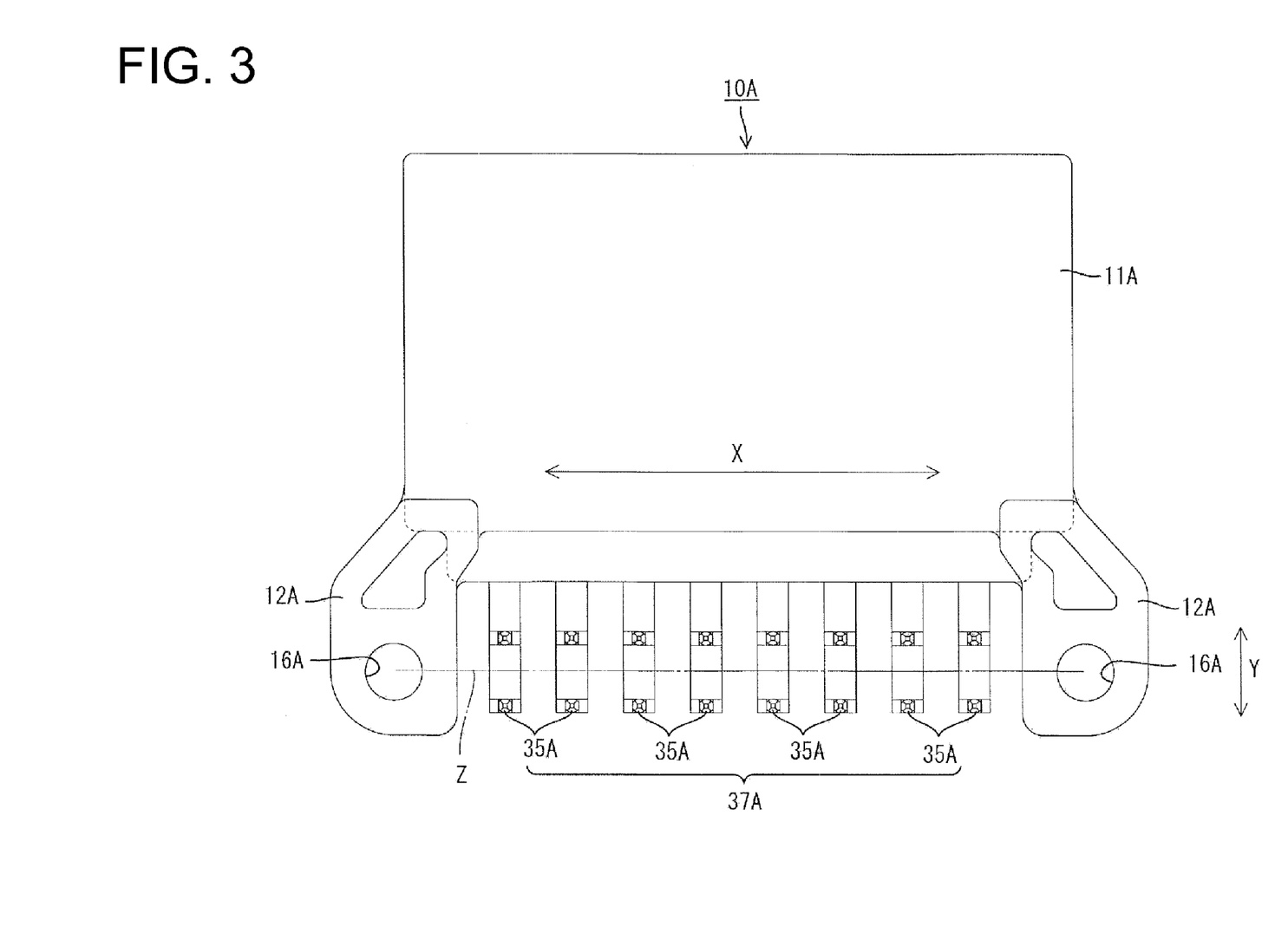
FIG. 3 is a bottom view of the horizontal connector.
Figure 4:
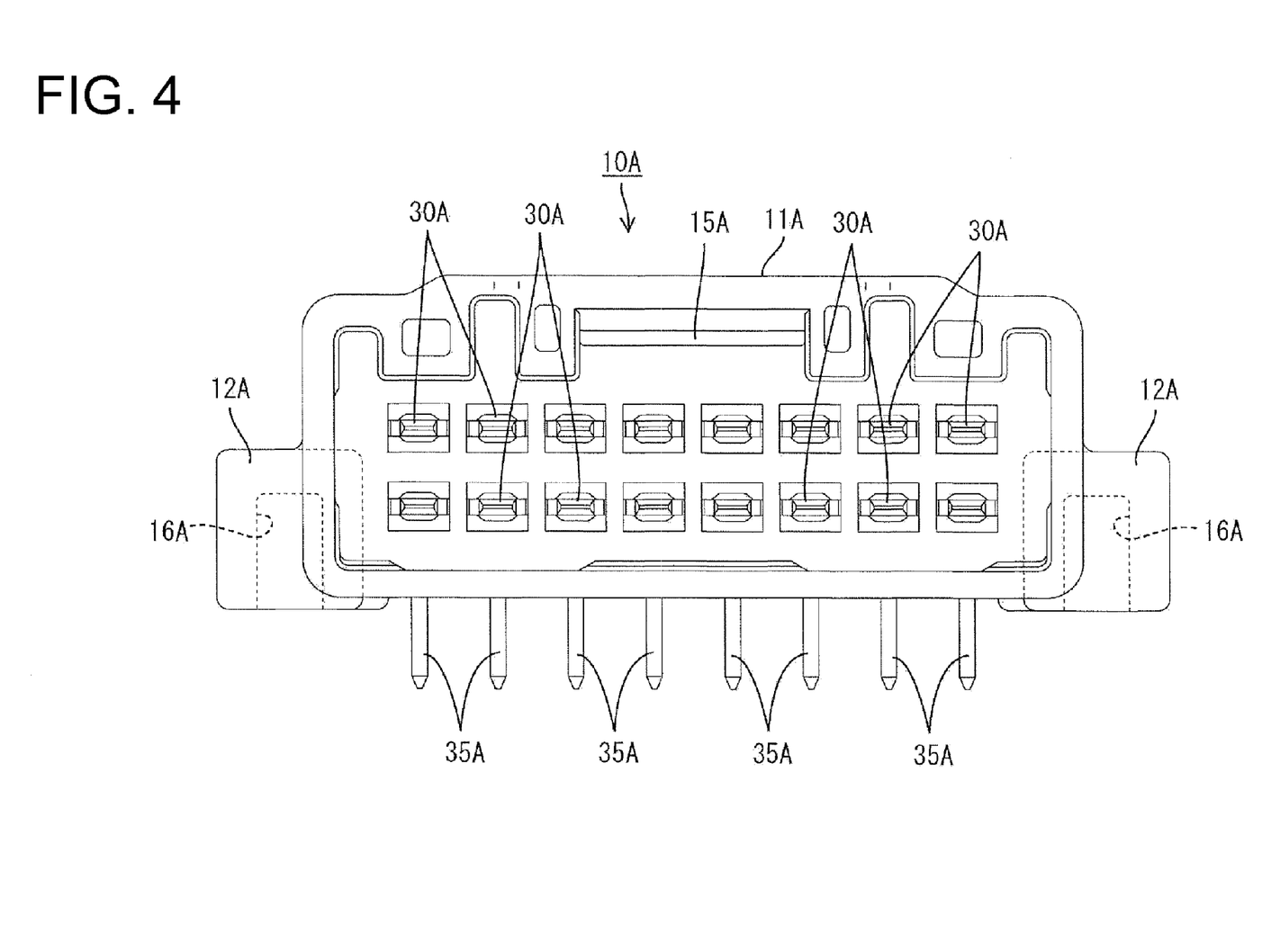
FIG. 4 is a front view of the horizontal connector.
Figure 5:
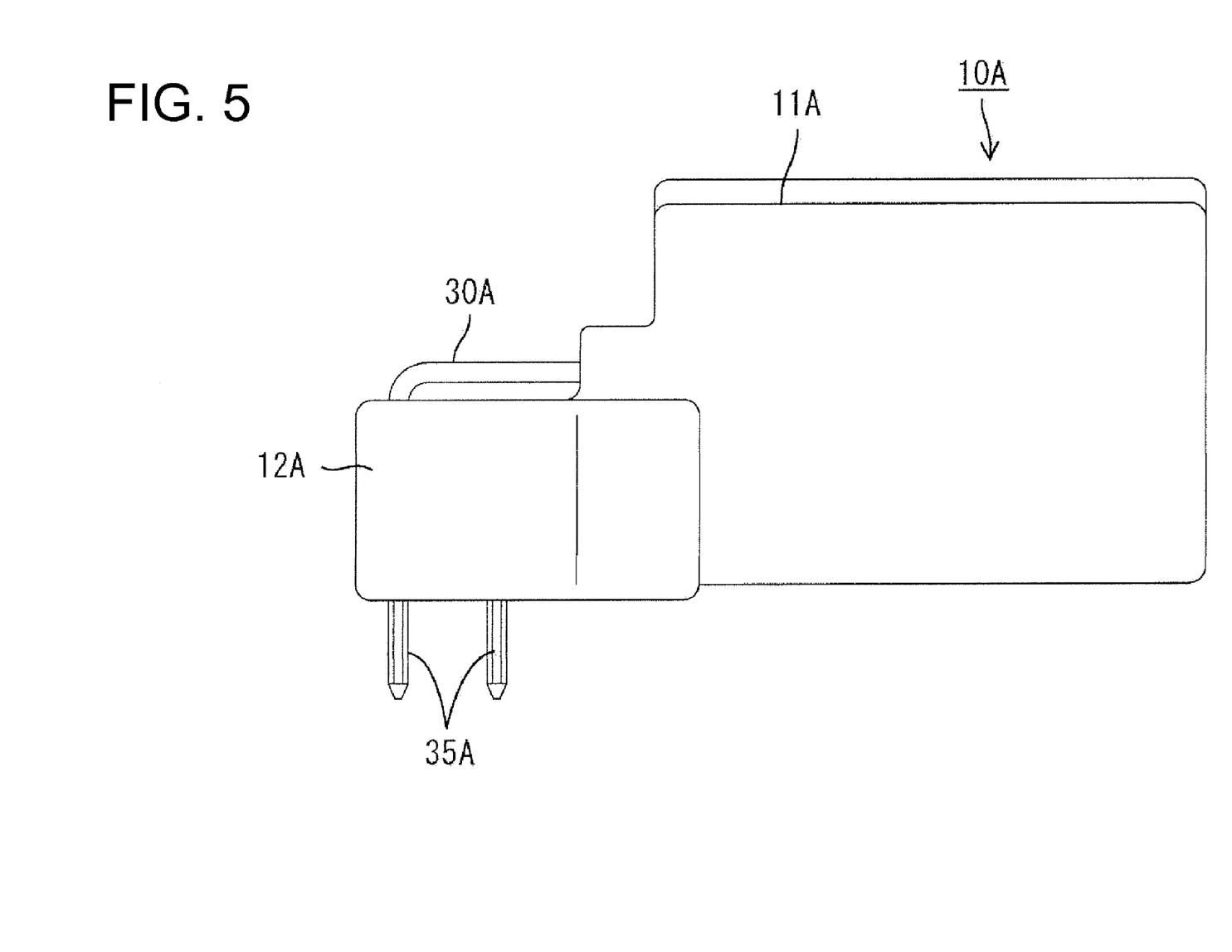
FIG. 5 is a side view of the horizontal connector.

Left and right mounting portions 12A project unitarily from the opposite sides of the rear end of the receptacle 11A. More specifically, the mounting portions 12A are arranged at opposite sides of the exposed parts of the terminal fittings 30A and extend like wings obliquely back from the opposite side surfaces of the receptacle 11A to avoid interference with exposed parts of the terminal fittings 30A, as shown in FIG. 3. Each mounting portion 12A is substantially a block having a flat upper surface with a height between the fitting holes 14A at the upper and lower stages. Accordingly, when the horizontal connector 10A is seen sideways, the exposed parts of the terminal fittings 30A mounted in the fitting holes 14A at the lowest stage are concealed by the respective mounting portions 12A (see FIG. 5) and cannot be seen.

Each mounting portion 12A is formed with a bottomed mount hole 16A that extends substantially vertically and substantially normal to the board surface direction BSD. A substantially round opening is formed in the bottom surface. The mounting hole 16A is aligned to communicate with a fixing hole 92 in the circuit board 90 in the mounted state on the circuit board 90. The mounting holes 16A of the respective mounting portions 12A are at opposite ends in a row direction (horizontal direction X in FIG. 3) with a terminal group 37A as an array of board connecting portions 35A in the row direction X and a column direction (vertical direction Y in FIG. 3) located therebetween. More specifically, the mounting holes 16A are arranged at opposite sides of the terminal group 37A in the row direction X and on a center line Z passing the center of the terminal group 37A in the column direction Y.

Figure 6:
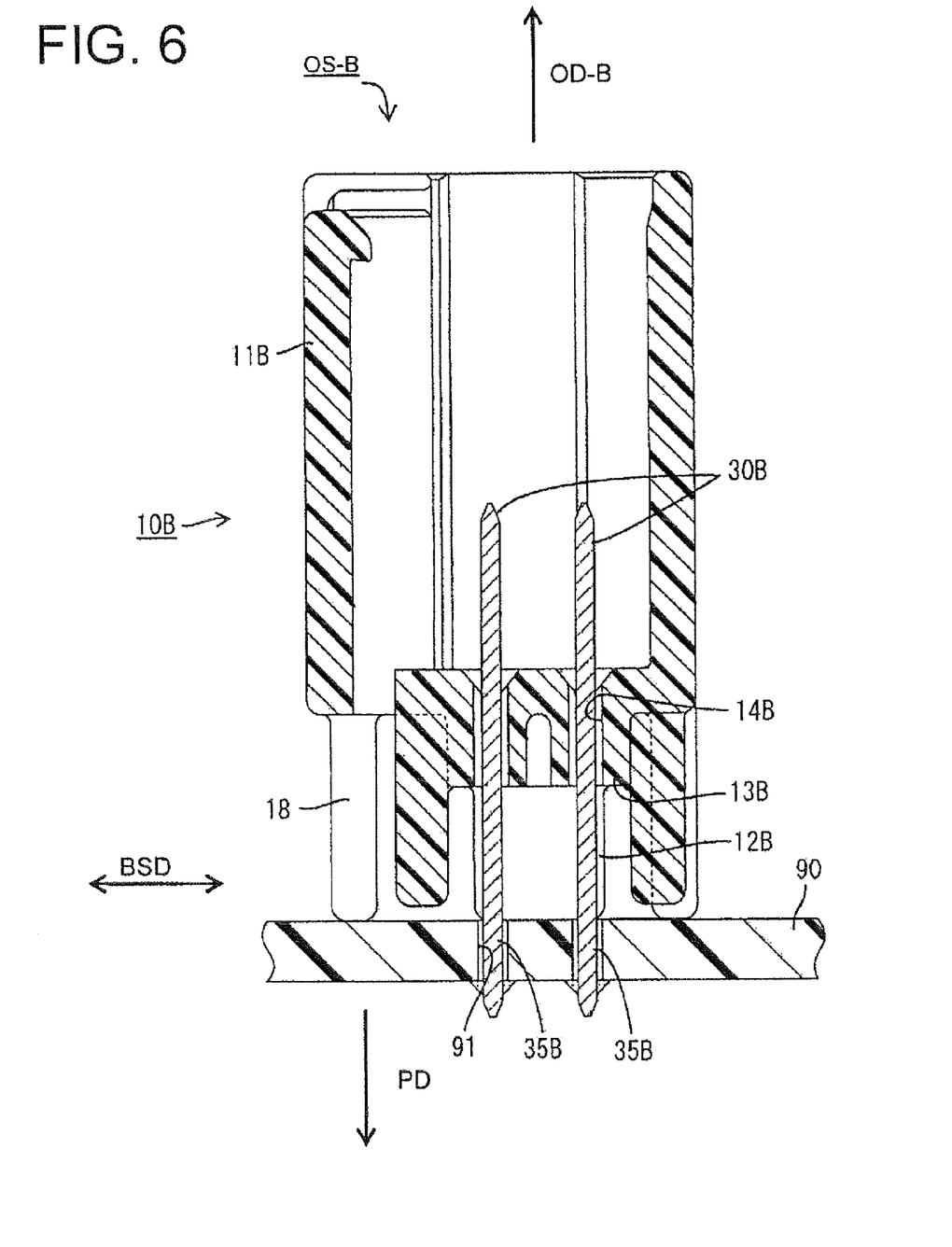
FIG. 6 is a section of a vertical connector mounted on the circuit board.
Figure 7:
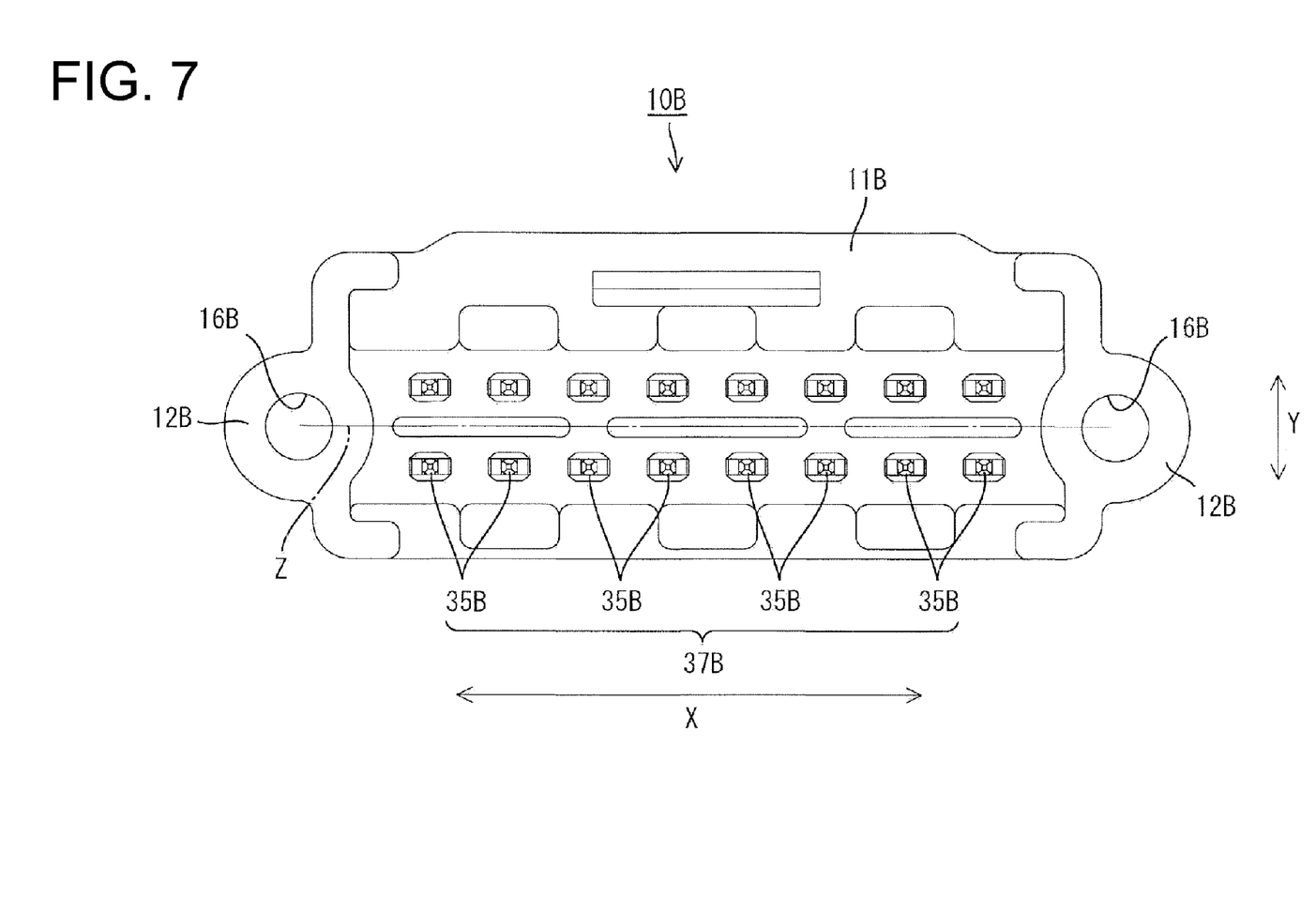
FIG. 7 is a bottom view of the vertical connector.
Figure 8:
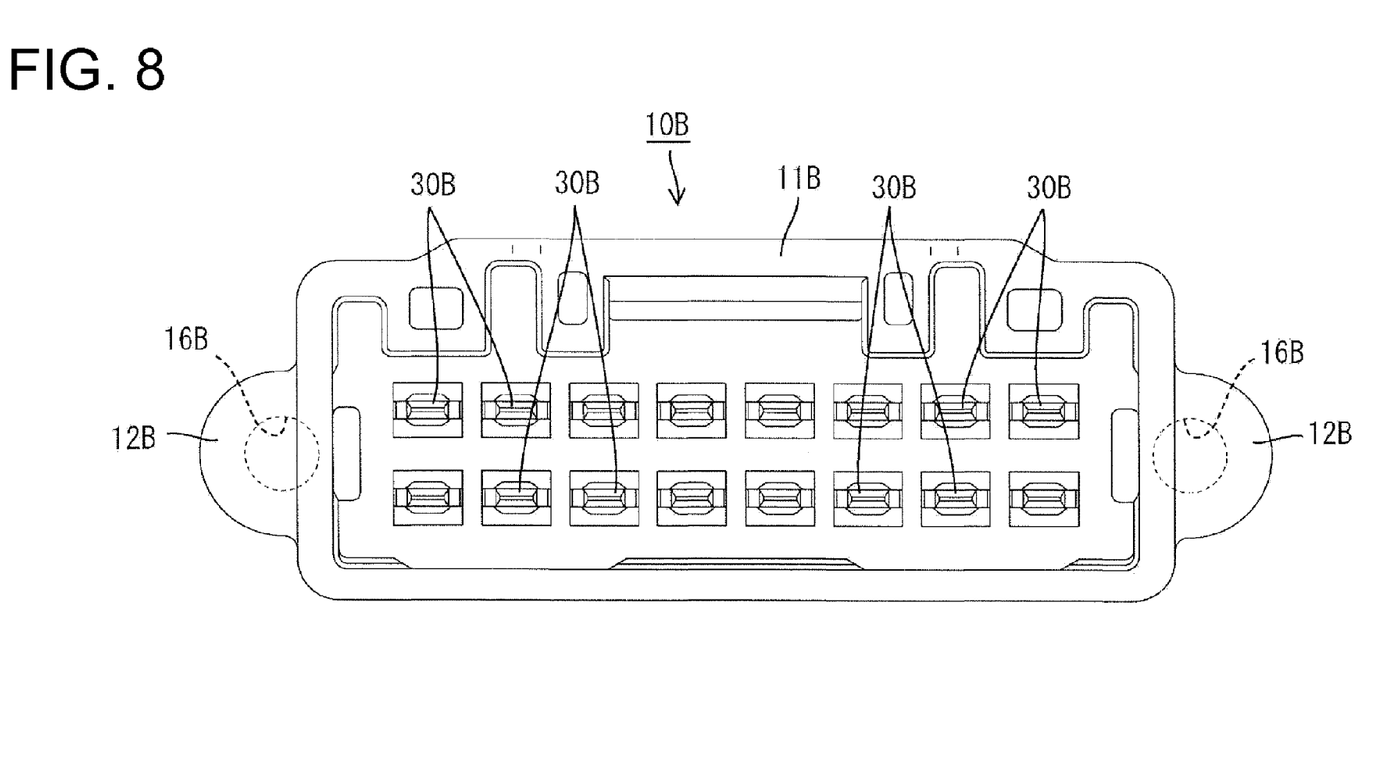
FIG. 8 is a plan view of the vertical connector.
Figure 9:
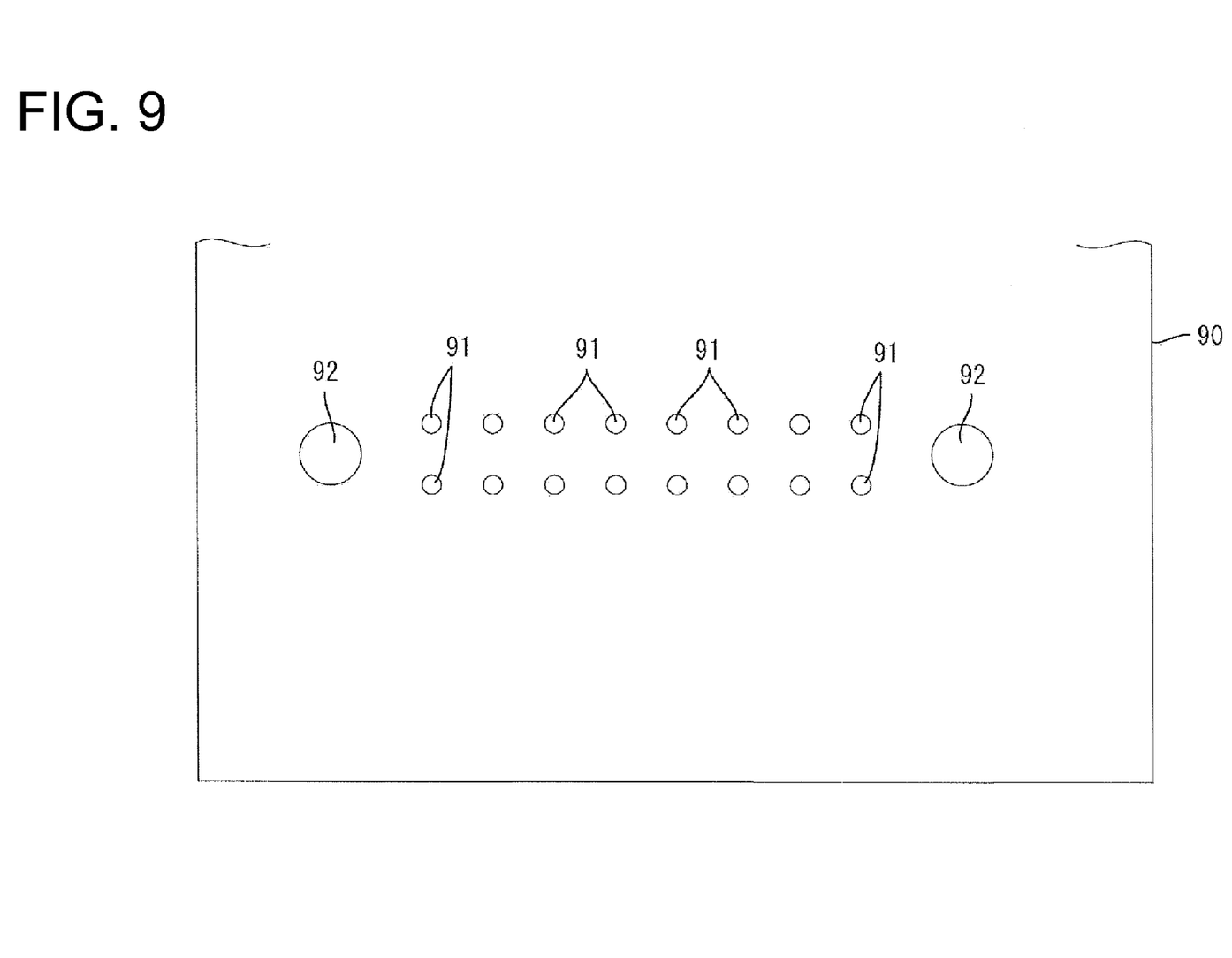
FIG. 9 is a plan view of an essential portion of the circuit board.

The vertical connector 10B is shown in FIGS. 6 to 8 and has a receptacle 11B with mounting portions 12B made e.g. of synthetic resin. The receptacle 11B is flat and wide, and a back wall 13B of the receptacle is formed with fitting holes 14B, through which the terminal fittings 30B are pressed. The fitting holes 14B are arranged at substantially the same positions as the fitting holes 14A of the horizontal connector 10A. With the vertical connector 10B mounted on the circuit board 90, an opening surface OS-B of the receptacle 11B is facing in a direction OD-B substantially normal to the board surface direction BSD of the circuit board 90, and a mating connector is fit into the receptacle 11B through the open surface from above and in a direction substantially perpendicular to the board surface direction BSD.

The vertical connector 10B also includes long narrow metal terminal fittings 30B that are straight in the vertical direction. An upper part of each terminal fitting 30B projects into the receptacle 11B, an intermediate part thereof penetrates through the back wall 13B of the receptacle 11B and a lower part thereof projects down from the back wall 13B of the receptacle 11B to be exposed. The terminal fitting 30B has a rounded pin-shaped board connecting portion 35B to be inserted into the connection hole 91 of the circuit board 90, and the remaining part other than the board connecting portion 35A is in the form of a that is a strip wider than the board connecting portion 35B. Accordingly, the terminal fitting 30B is substantially linear.

Left and right projections 18 project down from the opposite sides of the bottom end of the receptacle 11B, and exposed parts of the terminal fittings 30B, except the leading ends, are arranged to be protected between the two projections 18. Left and right mounting portions 12B are formed at the opposite sides of the bottom end of the receptacle 11B while being joined unitarily with the respective projections 18. Each mounting portion 12B has a bottomed substantially cylindrical shape extending in the projecting direction PD of the corresponding projection 18 and is formed internally with a mounting hole 16B extending substantially vertically and making a substantially round opening only in the bottom surface for communication with the fixing hole 92 of the circuit board 90.

The mounting holes 16B of the respective mounting portions 12B are arranged at the substantially opposite sides of the terminal group 37B in the row direction X in FIG. 7 and on a center line Z passing the center of the terminal group 37A in the column direction Y.

In the horizontal connector 10A and vertical connector 10B, the board connecting portions 35A, 35B of the respective terminal fittings 30A, 30B and the mounting holes 16A, 16B of the respective mounting portions 12A, 12B are identical in shape and are arranged at the same intervals, so that the shapes and arrangements thereof coincide. Thus, if the board connecting portions 35A, 35B of the terminal fittings 30A, 30B of the horizontal and vertical connectors 10A and 10B and the mounting holes 16A, 16B of the mounting portions 12A, 12B thereof are projected on the board surface of the circuit board 90, projected images substantially match and overlap at the same positions. On the other hand, the shapes and arrangements of the connection holes 91 and fixing holes 92 of the circuit board 90 substantially conform to those of the board connecting portions 35A, 35B of the terminal fittings 30A, 30B and the mounting holes 16A, 16B of the mounting portions 12A, 12B and, hence, conform to both horizontal connector 10A and vertical connector 10B (see FIG. 9).

One of the horizontal connector 10A or vertical connector 10B is selected for mounting on the circuit board 90, in consideration of whether interference with peripheral parts can be avoided, connection sides and/or directions with the respective mating connector(s), dimensional considerations and/or other factors.

Figure 2:
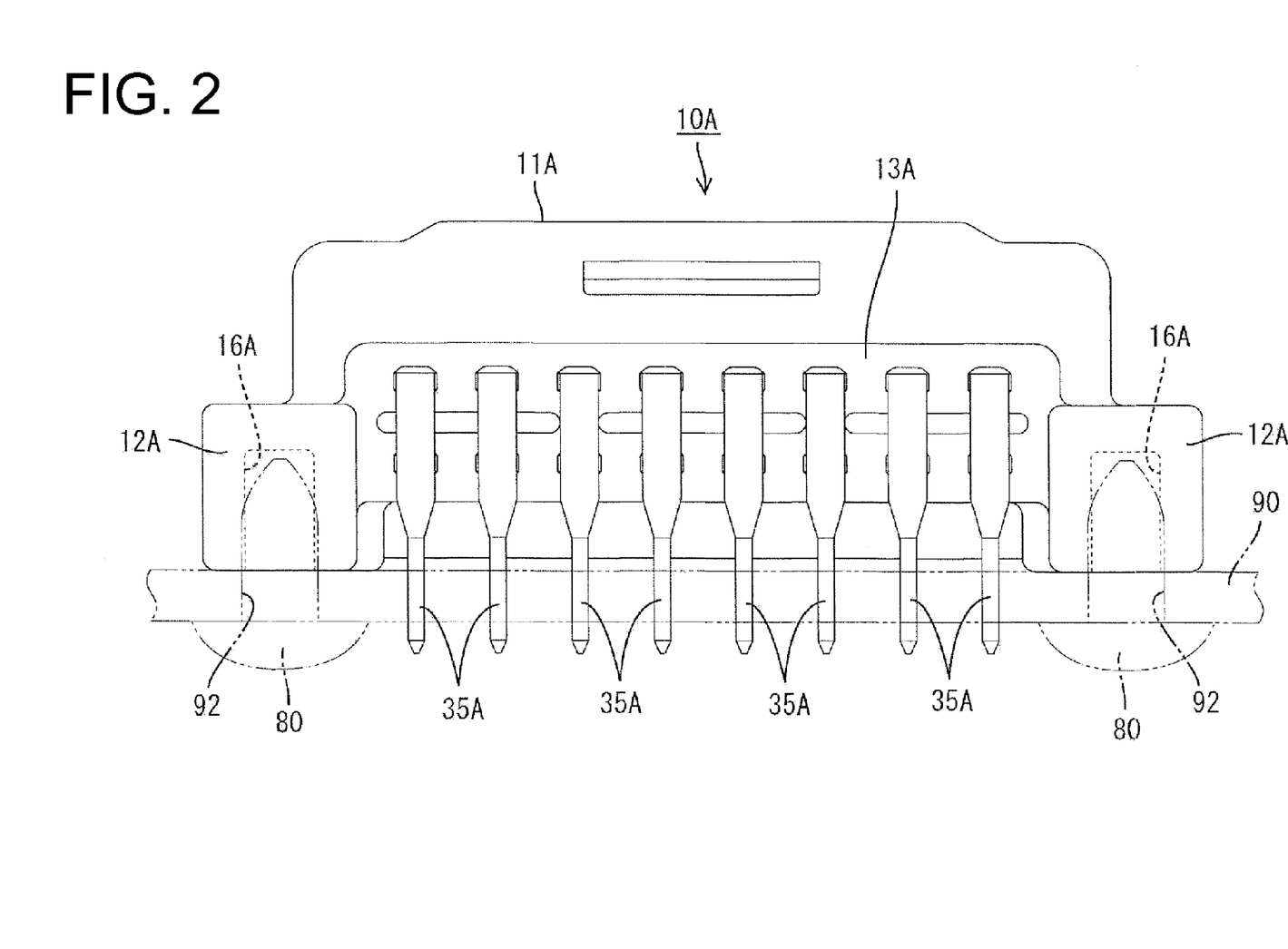
FIG. 2 is a rear view of the horizontal connector.

In the case of selecting the horizontal connector 10A, the L-shaped terminal fittings 30A are mounted by being pressed into the fitting holes 14A from behind. Subsequently, the board connecting portions 35A of the respective terminal fittings 30A are fit into the connection holes 91 of the circuit board 90 from above and the mounting holes 16A of the respective mounting portions 12A are aligned with the fixing holes 92 of the circuit board 90. Mounting members, such as tapping screws 80, then are inserted into the fixing holes 92 from below and at a side of the circuit board 90 opposite the mounting portions 12A. Leading ends of the tapping screws 80 then are inserted into the mounting holes 16A of the respective mounting portions 12A, as shown in FIG. 2. The external threads of the tapping screws 80 engage the inner surfaces of the respective mounting holes 16A to fix the receptacle 11A.

The board connecting portions 35A of the respective terminal fittings 30A then are connected electrically with conduction paths (not shown) on the circuit board 90 by soldering. It should be understood, however, that the terminal fittings 30A also may be connected to the conduction paths by press-fitting. The mounting holes 16A could be formed at positions displaced towards a first end of the terminal groups 37A of the board connecting portions 35A in the column direction Y and the receptacle 11A could be fixed at the first side in the column direction Y. In this case, the circuit board 90 may be inclined in a direction so that the board connecting portions 35A at the second end in the column direction Y come out of the corresponding connection holes 91 and create excessive stress on the second end of the terminal group 37A in the column direction Y while the board connecting portions 35A at the first end in the column direction Y are being soldered. However, the respective mounting holes 16A are at positions corresponding to the center line Z of the terminal group 37A in this embodiment. Thus, the degree of inclination of the circuit board 90 can be suppressed even if the circuit board 90 is inclined in a direction so that the board connecting portions 35A at the second end in the column direction Y come out of the corresponding connection holes 91 while the board connecting portions 35A at the first end in the column direction Y are being soldered. Therefore, excessive stress on the second end of the terminal group 37A in the column direction Y can be prevented. In this way, the horizontal connector 10A is fixed on the circuit board 90 in a proper substantially horizontal posture.

In the case of selecting the vertical connector 10B, the substantially straight terminal fittings 30B are mounted by being pressed into the fitting holes 14B from above. The board connecting portions 35B of the respective terminal fittings 30B then are inserted into the corresponding connection holes 91 of the circuit board 90 and the mounting holes 16B of the respective mounting portions 12B are aligned with the corresponding fixing holes 92 of the circuit board 90 to mount the vertical connector 10B on the circuit board 90. The respective mounting portions 12B then are fixed by mounting members, preferably by tapping screws 80, inserted into the mounting holes 16B and the respective board connecting portions 35B are connected with the connection holes 91 by press-fitting and/or soldering, as described above. The vertical connector 10B is fixed in a vertical posture with the opening surface OS-B of the receptacle 11B facing in the direction OD-B substantially normal to the board surface direction BSD of the circuit board 90. The mounting holes 16B are formed at positions substantially corresponding to the center line Z of the terminal group 37B in the column direction Y. Thus, the above-described effect of satisfactorily performing the soldering at the opposite ends of the terminal group 37B in the column direction Y can be fulfilled.

The board connecting portions 35A, 35B and the mounting holes 16A, 16B are arranged at substantially the same relative positions in the horizontal connector 10A and vertical connector 10B. Thus, the connection holes 91 and the fixing holes 92 of the circuit board 90 also are arranged at substantially the same positions. Accordingly, one type of the circuit board 90 can be used commonly for both connectors 10A, 10B. Hence, versatility of the circuit board 90 is improved and costs are decreased.

The respective mounting holes 16A, 16B are arranged at opposite sides of the terminal groups 37A, 37B in the row direction X in both the horizontal connector 10A and the vertical connector 10B. Thus, the formation range of the connection holes 91 and the fixing holes 92 of the circuit board 90 is smaller in the column direction Y to utilize space in the column direction Y more efficiently.

The mounting portions 12A of the horizontal connector 10A project back in a direction opposite to the opening direction OD-A from the rear ends of the opposite side surfaces of the receptacle 11A and are arranged to cover the exposed parts of the respective terminal fittings 30A at the opposite sides in the row direction X. Thus, exposed parts of the respective terminal fittings 30A are not likely to be deformed by interference with external matter.

The invention is not limited to the above described and illustrated embodiment. For example, the following embodiments are also embraced by the technical scope of the present invention as defined by the claims. It should be appreciated that the following embodiments are applicable to both horizontal connectors and vertical connectors.

The mounting portions may be arranged at the substantially opposite sides of the terminal group in the row direction while being displaced toward one side of the terminal group in the column direction.

The mounting portions may be arranged at the substantially opposite sides or one side of the terminal group in the row direction.

The mounting portions may be formed as resiliently deformable leg pieces and may be attached to the circuit board by being resiliently engaged with the opening edges of the fixing holes at the underside of the circuit board.

Screws as mounting members may be inserted through the mounting holes and fastened with nuts. Any other mounting member such as rivets, clamps or the like may be used as the mounting member to fasten the connector to the circuit board.

The mounting holes may penetrate through the mounting portions.

The terminal fittings may be formed as press-fit terminals to be pressed into contact with contact points formed on the inner surfaces of the connection holes of the circuit board.

The terminal fittings may be inserted into the fitting holes from front.

The terminal fittings may be mounted through the back wall of the receptacle by insert molding.

The terminal fittings may be mounted at one stage (one row in the column direction), three stages (three rows in the column direction) or more through the back wall of the receptacle.

The invention also is applicable to hybrid circuit board connectors with terminal fittings of different shapes and/or sizes, such as large and small terminal fittings.

It should be understood that the connectors may have any orientation with respect to the circuit board. Furthermore, three or more different connectors may have different orientations, but all have parts of terminal fittings to be inserted into connection holes and parts to be mounted with respect to fixing holes being arranged at substantially the same positions.

What is claimed is:

1. A set of circuit board connectors comprising at least first and second types of connectors, each type of connector having a receptacle for receiving a mating connector, terminal fittings mounted through a back wall of the receptacle and projecting rearward from the back wall for insertion into connection holes of a circuit board, and mounting portions projecting out from the receptacle and configured to be mounted to fixing holes of the circuit board, wherein:

the first type of connector being configured for mounting on the circuit board so that a connecting direction with the mating connector is substantially parallel to a board surface direction of the circuit board, the second type of connector being configured for mounting on the circuit board so that a connecting direction with the mating connector intersects the board surface direction, parts of the terminal fittings insertable into the connection holes being arranged in row and column directions to form a terminal group for each of the connectors and parts of the mounting portions to be mounted with respect to the fixing holes being arranged in a pair at opposite sides of the terminal group in the row direction and at positions corresponding to a center of the terminal group in the column direction, the parts of the respective terminal fittings to be inserted into the connection holes and the parts of the mounting portions to be mounted to the fixing holes are at substantially the same relative positions in the first and second connectors, whereby the connection holes of the circuit board and the fixing holes of the circuit board can accommodate the terminal fittings and the mounting portion of either of the first type of connector or the second type of connector; and wherein the mounting portions of the first connector are at opposite sides in the row direction so that the parts of the respective terminal fittings projecting rearward from the back wall of the receptacle are located between and protected by the mounting portions in the row direction and wherein the mounting portions of the first connector extend obliquely back from opposite sides of the receptacle to avoid interference with the parts of the respective terminal fittings projecting reward from the back wall of the receptacle.

2. The set of connectors of claim 1, wherein the mounting portion of the first type of connector has a projecting distance from the circuit board which is set beyond a height of the terminal fitting to be located most closely to the circuit board.

3. The set of connectors of claim 1, wherein the second connector comprises at least two lateral projections projecting towards the circuit board so that exposed parts of the terminal fittings except leading end portions are between and protected by the projecting pieces.

4. The set of connectors of claim 1, further comprising mounting members insertable into the fixing holes from a side opposite to a mounting side of the circuit board and the leading ends of the mounting members are engaged with mounting holes of the respective mounting portions.

5. The set of connectors of claim 4, wherein the mounting members comprise tapping screws, wherein external threads of the tapping screws engage inner surfaces of the respective mounting holes to fix the receptacle to the circuit board.

* * * * *